(12) United States Patent
Chang et al.

(10) Patent No.: US 7,131,487 B2
(45) Date of Patent: Nov. 7, 2006

(54) USE OF ADJUSTED EVAPORATOR SECTION AREA OF HEAT PIPE THAT IS SIZED TO MATCH THE SURFACE AREA OF AN INTEGRATED HEAT SPREADER USED IN CPU PACKAGES IN MOBILE COMPUTERS

(75) Inventors: Je Young Chang, San Jose, CA (US); Eric DiStefano, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 10/022,760

(22) Filed: Dec. 14, 2001

(65) Prior Publication Data

US 2003/0111213 A1   Jun. 19, 2003

(51) Int. Cl.
*F28F 7/00* (2006.01)
(52) U.S. Cl. ............................. 165/104.33; 165/80.3; 165/80.4; 165/185; 165/122; 257/706; 257/714; 257/715; 257/721; 257/722; 361/689; 361/690; 361/694; 361/695; 361/696; 361/697; 361/698; 361/699; 361/700; 361/703; 361/704
(58) Field of Classification Search ........... 165/104.33, 165/185, 80.3, 80.4, 122; 361/699, 689, 361/690, 694–700, 703, 704; 257/706, 714, 257/715, 721, 722
See application file for complete search history.

(56) References Cited

U.S. PATENT DOCUMENTS 4,966,226 A * 10/1990 Hamburgen ........... 165/104.26
5,076,351 A * 12/1991 Munekawa et al. ..... 165/104.21
5,095,404 A *  3/1992 Chao ..................... 361/700
5,224,030 A *  6/1993 Banks et al. ............ 361/717
5,339,214 A *  8/1994 Nelson .................. 361/695
5,412,535 A *  5/1995 Chao et al. .............. 361/700
5,451,352 A *  9/1995 Cook ..................... 264/102
5,960,865 A * 10/1999 Costa et al. ............. 165/86
D419,979 S *  2/2000 Lu et al. ................. D14/439
6,125,035 A *  9/2000 Hood et al. ............. 361/687
6,178,088 B1 * 1/2001 Gates ..................... 361/699
6,233,146 B1 * 5/2001 Gilchrist et al. .......... 361/687
6,304,450 B1 * 10/2001 Dibene, II et al. ........ 361/704
6,345,664 B1 * 2/2002 Katsui .................... 165/80.3
6,357,515 B1 * 3/2002 Bhatia .................... 165/80.3
6,373,700 B1 * 4/2002 Wang ..................... 361/698
6,408,935 B1 * 6/2002 DeHoff et al. ........... 165/80.3
6,504,720 B1 * 1/2003 Furuya ................... 361/699
6,535,386 B1 * 3/2003 Sathe et al. .............. 361/700
6,681,487 B1 * 1/2004 Sagal et al. ............. 29/890.032
6,695,041 B1 * 2/2004 Lai et al. ............... 165/104.33
6,880,624 B1 * 4/2005 Pinneo ................... 165/104.21

* cited by examiner

*Primary Examiner*—Henry Bennett
*Assistant Examiner*—Nihir Patel
(74) *Attorney, Agent, or Firm*—Blakely, Sokoloff, Taylor & Zafman LLP

(57) ABSTRACT

An apparatus for cooling heat producing devices is disclosed. In one embodiment, the apparatus includes a heat absorber attached to a first end of a base. Both the base and the heat absorber may be formed of a thermally conductive material, and a width of the heat absorber is greater than a width of the base.

13 Claims, 4 Drawing Sheets

USE OF ADJUSTED EVAPORATOR SECTION AREA OF HEAT PIPE THAT IS SIZED TO MATCH THE SURFACE AREA OF AN INTEGRATED HEAT SPREADER USED IN CPU PACKAGES IN MOBILE COMPUTERS

FIELD OF THE INVENTION

The present invention relates to cooling devices generally, and more particularly, to remote type heat exchangers having a heat absorbing section of a surface area approximately equal to the surface area of a heat spreader with a surface area of a heat producing device.

BACKGROUND OF THE INVENTION

Electronic devices, such as microprocessors, become heated during use. If the excess heat is not efficiently dissipated, it can impair performance by slowing the processing times. Thus, solutions have been proposed which provide ways of cooling the hot electronic devices.

Conventionally, heat exchangers (e.g., devices which absorb heat from one area and transfer it to another area for dissipation) are mounted directly above the heat producing device. Such heat exchangers tend to be of a uniform width and tend to dissipate the excess heat through a plurality of fins stacked above the base of the heat exchanger. Although efficient, this type of heat exchanger is not desirable in mobile computing systems because the height of the heat exchanger exceeds the depth of a mobile computer casing.

Another type of heat exchanger, called a remote heat exchanger, is used in mobile computing systems. Conventional remote heat exchangers include a base member (e.g., a heat pipe) of uniform width, and a plurality of fins attached to one end of the base. Although the end opposite the fins may be applied directly to a silicon die (e.g., a processor), a more efficient heat transfer occurs when a heat spreader is used. A heat spreader is a piece of heat conductive material, generally having a cross-sectional area larger than a surface area of the heat producing device. Typically the uniform width of the heat exchanger base is less than the width of the heat spreader. Consequently, a less-than-optimum cooling results because heat escaping through portions of the heat spreader not covered by the base is dissipated into the air rather than being conveyed through the base to a remote heat dissipation area.

BRIEF DESCRIPTION OF THE DRAWINGS

The present invention is illustrated by way of example and not limitation in the figures of the accompanying drawings, in which.

DETAILED DESCRIPTION OF THE PREFERRED EMBODIMENT

An apparatus and method for using an adjusted evaporation section area of heat pipe that is sized to match the surface area of an integrated heat spreader used in CPU packages in mobile computers is disclosed. In the following detailed description, numerous specific details are set forth in order to provide a thorough understanding of the present invention. However, it will be apparent to one of ordinary skill in the art that these specific details need not be used to practice the present invention. In other circumstances, well-known structures, materials, or processes have not been shown or described in detail in order not to unnecessarily obscure the present invention.

Figure 1:
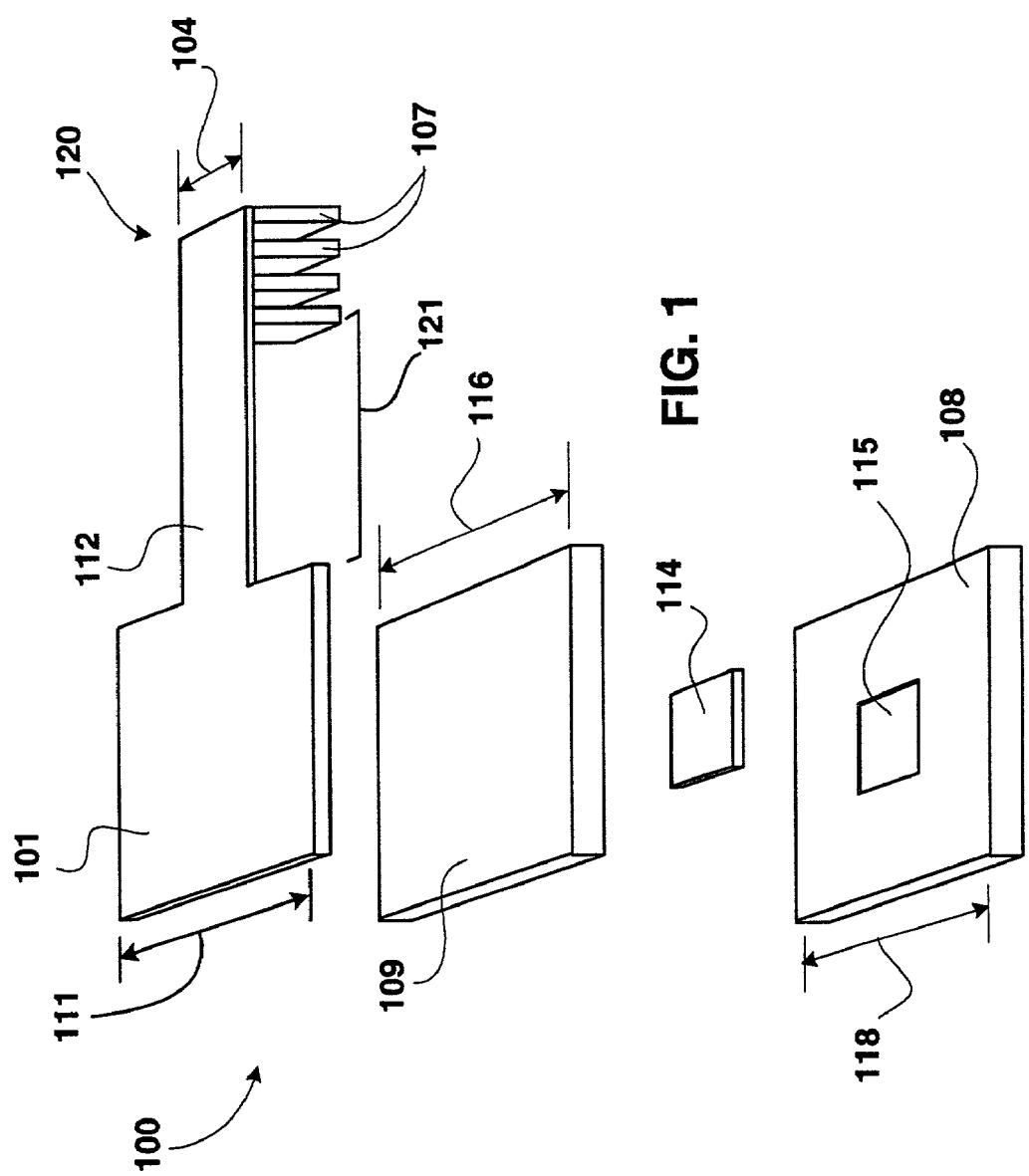
FIG. 1 is an exploded perspective view of a cooling system, according to one embodiment of the invention.

FIG. 1 is an exploded perspective view of a cooling system 100 according to one embodiment of the invention. Cooling apparatus 120 may be formed of a thermally conductive material such as copper, a copper alloy, aluminum, or other heat conductive material known in the art. A first end of base member 112 is attached to a heat absorber 101. A second end of base member 112 is attached to a plurality of fins 107, which may be made of the same or different material as base 112 and absorber 101. In a preferred embodiment, fins 107 are separated a distance 121 from the edge of heat absorber 101. Heat absorber 101 is attached to the first end of base 112 as shown, and may be formed of the same or different material as base 112. Additionally, heat absorber 101 may have the same or different thickness than base 112. Heat absorber 101 may have any conceivable shape, but in one embodiment, has a square cross-sectional area, when sliced horizontally. The dimensions of heat absorber 101 (and of cooling apparatus 120 generally) may vary depending on the particular application and operating environment. In one embodiment, for example, heat absorber 101 may have a width 111 greater than a width 104 of a base 112, where the width 104 of base 112 is substantially uniform along the base of 112.

As shown in FIG. 1, heat absorber 101 may have a top surface and a bottom surface. In one embodiment, one or both surfaces are substantially planar. Preferably, at least the bottom surface of heat absorber 101 is substantially planar to permit an efficient transfer of heat from the substantially planar exterior surface of heat spreader 109 or of a silicon die (e.g., a microprocessor) 114. In one embodiment, the dimensions of heat absorber 101's bottom surface approximately equal or slightly exceed the dimensions of heat spreader 109's or silicon die 114's mating surface (e.g., top surface in FIG. 1). In this manner, a first surface area associated with the bottom surface of heat absorber 101 may approximately equal a second surface area associated with the mating surface of either heat spreader 109 or silicon die 114. Heat absorber 101 may be attached to heat spreader 109 or silicon die 114 using a thermal adhesive and/or a thermal interface material.

Heat spreader 109 may be a metal plate affixed to a mating surface of a heat producing electric or digital device, such as a silicon die (e.g., a microprocessor) 114. In one embodiment, a first surface area associated with the bottom surface of heat absorber 109 will be greater than a second surface area associated with the mating surface of silicon die 114. Preferably, heat spreader 109 is made of a thermally conductive material such as copper. It will be appreciated that heat spreader 109 may be attached to silicon die 114 using techniques and materials known to persons skilled in the manufacturing arts.

Silicon die 114 may be an electronic or digital device, such as a microprocessor. As shown in FIG. 1, silicon die 114 may be attached on the area 115 of a CPU package substrate 108, which has a width 118 approximately equal to or slightly greater than the width 116 of heat spreader 109. Depending on the embodiment, the top surface of the CPU package substrate 108 may have a surface approximately equal to or greater than a surface area associated with the bottom surface of heat spreader 109.

Figure 2:
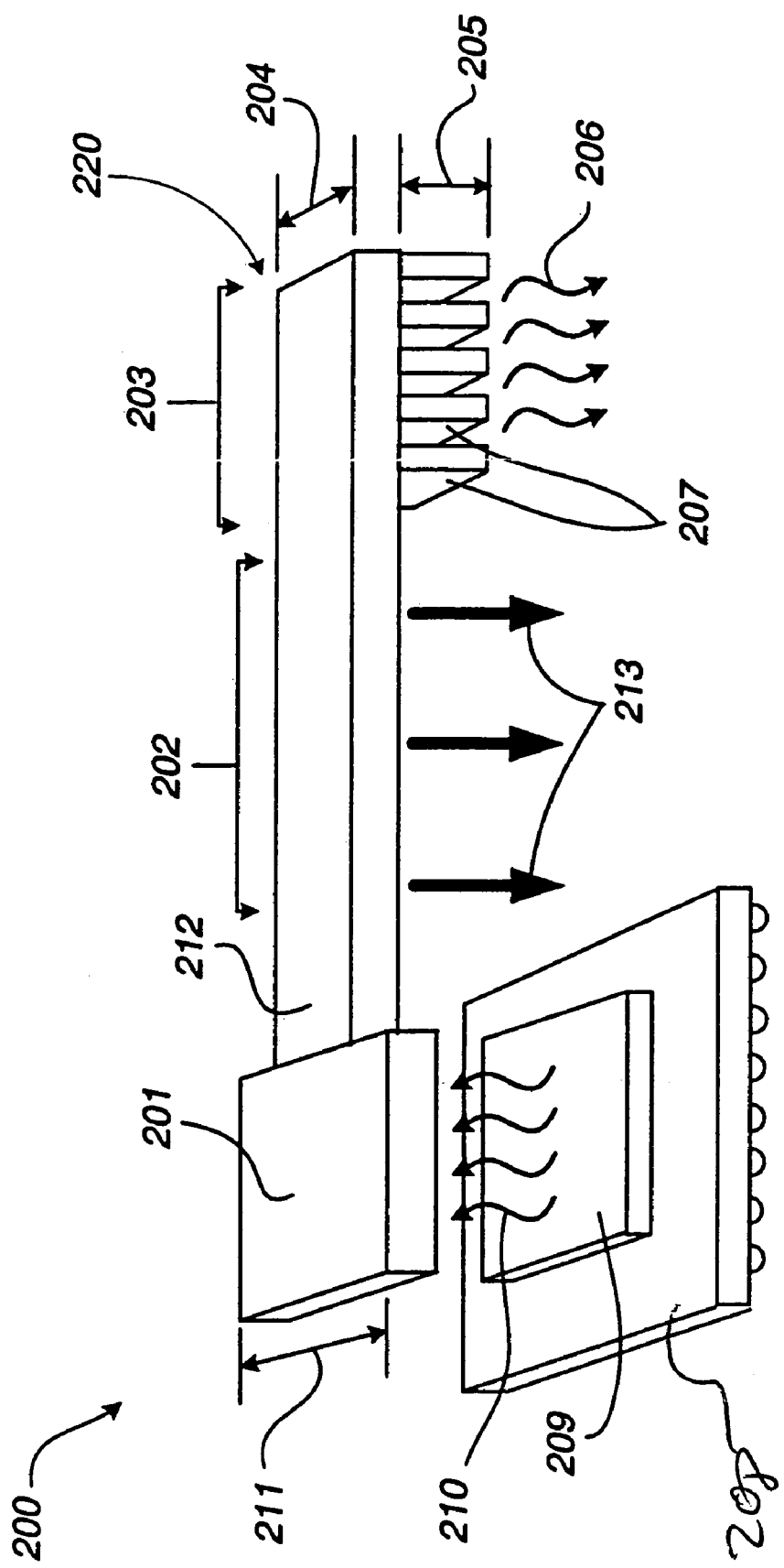
FIG. 2 is an exploded perspective view of a cooling system, according to one embodiment of the invention.

Referring to FIGS. 1 and 2, cooling apparatus 120 operates in the conventional manner. Current is applied via CPU package substrate 108 to silicon die 114 such that the electronic or digital device performs predetermined tasks and operations, such as floating point operations, for example. Heat 210 generated during operation of device 114 flows through heat spreader 109 (209 in FIG. 2) where it is absorbed by heat absorber 101 (201 in FIG. 2) and thermally conducted along adiabatic region 202 of base 112 (212 in FIG. 2) into a plurality of fins 107 (207 in FIG. 2) attached to the bottom surface of heat dissipating region 203. Air moving past fins 107 dissipates the heat 206 accumulated in fins 107. In this manner, the temperature of heat producing device 114 may be lowered or kept within acceptable operating tolerances.

Referring again to FIG. 2, there is shown a perspective view of a partially assembled cooling system 200, which may include, in one embodiment: a cooling apparatus 220, a heat spreader 209, a heat producing device (not shown) and a CPU package substrate 208. As indicated by arrows 213, the cooling apparatus 220 may be moved in the direction of the arrows 213 to mate heat absorber 201 with heat spreader 209. Base 212, in one embodiment, includes an adiabatic region 202, and a heat dissipating region 203. Base 212 also has a substantially uniform width 204, which in one embodiment, is less than the width 211 of heat absorber 201. Additionally, each of fins 207 may have a length 205 approximately equal to width 204 of base 212.

Figure 3:
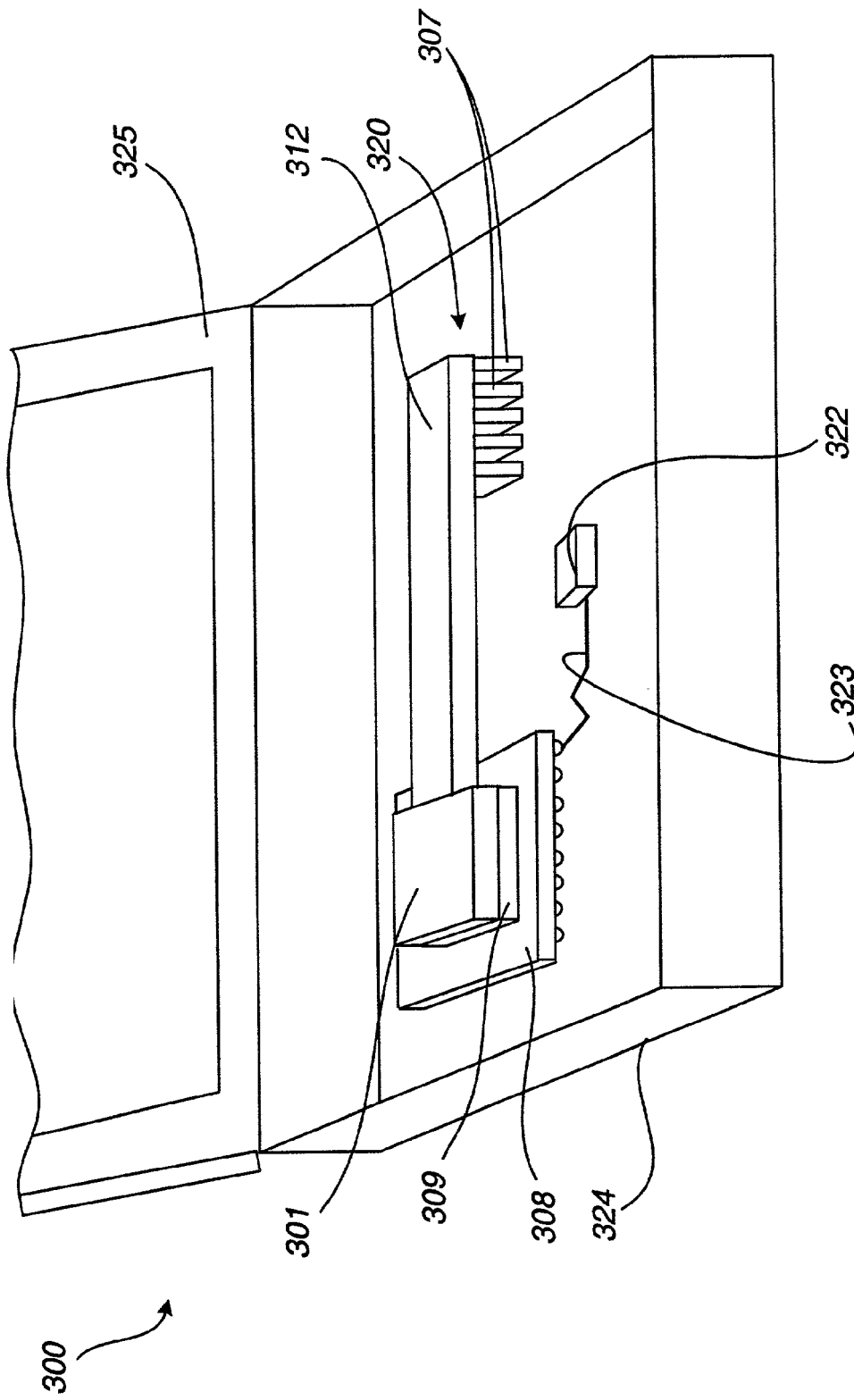
FIG. 3 is a perspective view of a cooling system usable in a computer environment, according to one aspect of the invention.

Although the cooling system of the present invention may be applied in various operating environments, such as desktop computing environments, a preferred operating environment is that of a mobile (or notebook) computer, a perspective view of which is illustratively shown in FIG. 3. In FIG. 3, notebook computer 300 includes a top case 325 hingedly connected to bottom case 324, which houses various internal components such as, but not limited to, a printed circuit board (not shown), optical drives, magnetic drives, processors, modem cards, Ethernet cards, memory chips 322, internal buses 323, display drivers, etc. In FIG. 3, the top surface of bottom case 324 has been removed to show placement of a cooling apparatus 320 within case 324. It will be appreciated that the components of notebook computer 300 and cooling apparatus 320, and not limited to those shown in FIG. 3 are not drawn to scale. However, as shown in FIG. 3, heat absorber 301 is attached to heat spreader 309, which covers the heat producing device (not shown), which may be a microprocessor attached to a CPU package substrate 308 that communicates with a memory 322 via a bus 323 in a printed circuit board (not shown), as shown. In one embodiment, the heat producing device to be cooled may be positioned near the center of case 324 such that base 312, extending away from the heat producing device, positions fins 307 near a vented corner or side of case 324. Optionally, a fan may be provided within case 324 to direct air across fins 307 and/or base 312.

Figure 4:
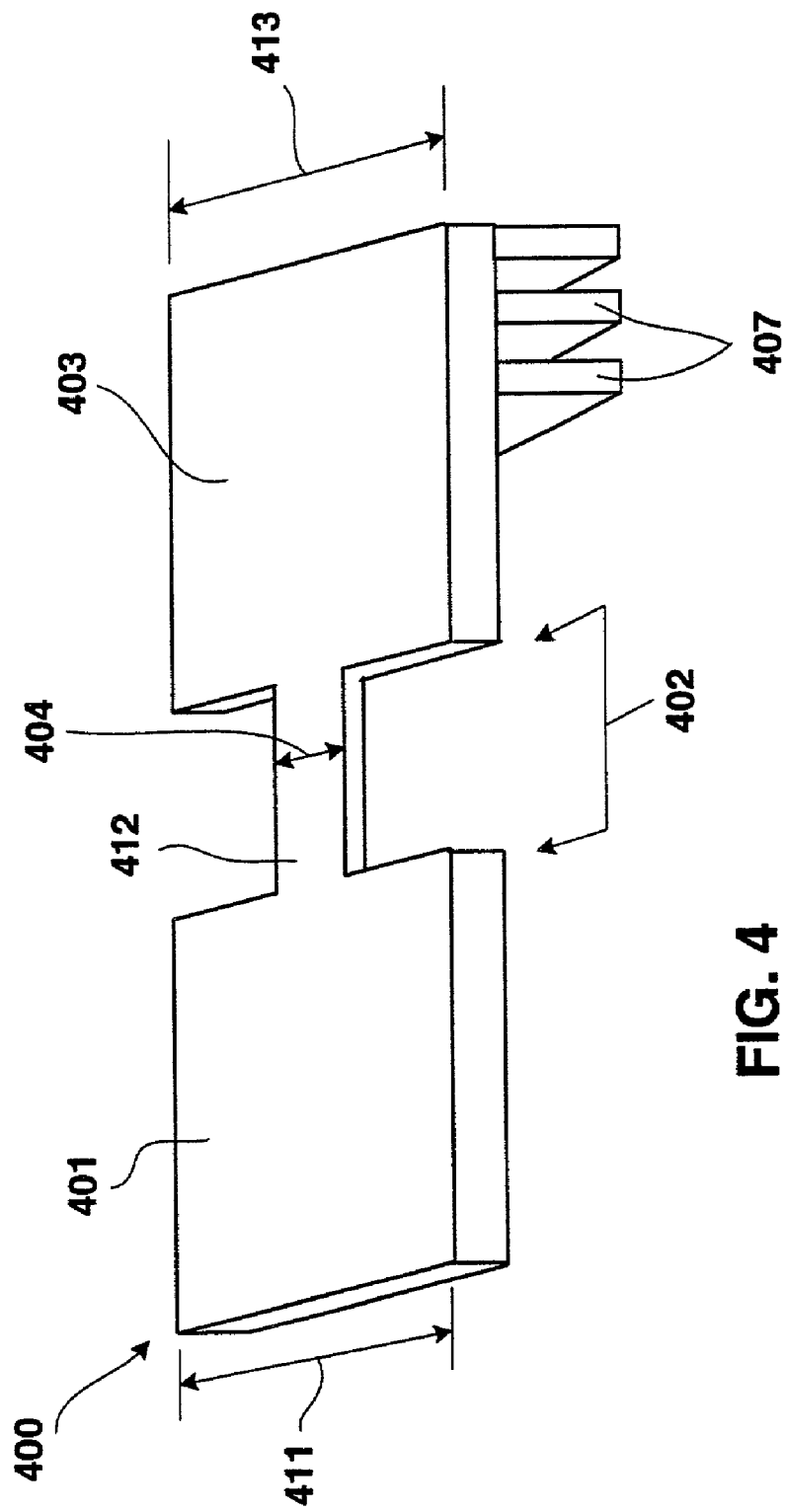
FIG. 4 is another perspective view of a cooling apparatus, according to one embodiment of the invention.

Referring now to FIG. 4, there is shown a perspective view of another embodiment of cooling apparatus 400, which may include absorber 401, a base 412, a heat dissipator 403, and a plurality of fins 407. As shown in FIG. 4, heat absorber 401 is attached to a first end of base 412, and heat dissipator 403 is attached to the second end of base 412. The plurality of fins 407 are attached to a bottom surface of heat dissipator 403.

In one embodiment, base 412 has a substantially uniform width 404 along the length 402 of base 412. Width 404 may be less than the width 411 of heat absorber 401, and less than width 413 of heat dissipator 403. Heat absorber 401 may be separated from heat dissipator 403 by a distance 402. It will be appreciated that the dimensions of cooling apparatus 400, as well as the dimensions of heat absorber 401, heat dissipator 403, and fins 407, may vary according to a particular application and/or operating environment. Thus, width 413 may or may not approximately equal width 411.

Thus, an apparatus and method for using an adjusted evaporation section area of heat pipe that is sized to match the surface area of an integrated heat spreader used in CPU packages in mobile computers is disclosed. Although the present invention is described herein with reference to a specific preferred embodiment, many modifications and variations therein will readily occur to those with ordinary skill in the art. Accordingly, all such variations and modifications are included within the intended scope of the present invention as defined by the following claims.

What is claimed is:

1. An apparatus, comprising:
an absorber section of a heat pipe attached to a first end of a base of the heat pipe to remove heat from a heat spreader, wherein the absorber section having a size of at least a surface area of the heat spreader;
a dissipater section of the heat pipe attached to a second end of the base of the heat pipe, wherein a width of the dissipater section is greater than a width of the base of the heat pipe, and the dissipater section having a size of at least a surface area of the absorber section; and
a plurality of fins formed of the second end of the base, the plurality of fins attached to a bottom surface of the dissipater section, the fins having a length approximately equal to the width of the base.

2. A computer system, comprising:
a central processing unit (CPU);
a heat absorber attached to a first end of a base of a heat pipe and having a size of at least a surface area of a heat spreader;
a heat dissipater attached to a second end of the base of the heat pipe, wherein a width of the heat dissipater is greater than a width of the base of the heat pipe, and the heat dissipater having a size of at least a surface area of the heat absorber; and
a plurality of fins formed on the second end of the base, the plurality of fins attached to a bottom surface of the heat dissipater, the plurality of fins having a length approximately equal to the width of the base.

3. The apparatus of claim 1, wherein the absorber section and the base of the heat pipe are formed of a thermally conductive material selected from the group including copper, a copper allow, and aluminum.

4. The apparatus of claim 1, wherein the absorber section is attached to the heat spreader by a thermal interface material.

5. The apparatus of claim 1, wherein the plurality of fins are formed of a thermally conductive material selected from the group including copper, a copper alloy, and aluminum.

6. The apparatus of claim 1, wherein the absorber section and the dissipater section are the same size.

7. The system of claim 2, wherein the heat absorber and the base of the heat pipe are formed of a thermally conductive material selected from the group including copper, a copper allow, and aluminum.

8. The system of claim 2, wherein the heat absorber is attached to the heat spreader by a thermal interface material.

9. The system of claim 2, wherein the heat absorber removes heat from the heat spreader.

10. The system of claim 2, further comprising a fan to direct air across at least one of the plurality of fins and the base of the heat pipe to dissipate heat produced by the CPU.

11. The system of claim 2, wherein the plurality of fins are formed of a thermally conductive material selected from the group including copper, a copper alloy, and aluminum.

12. The apparatus of claim 1, wherein the absorber section removes heat from the heat spreader.

13. The apparatus of claim 1, wherein a fan directs air across at least one of the plurality of fins and the base of the heat pipe to dissipate heat produced by a central processing unit (CPU) and absorbed by the heat absorber.

* * * * *